United States Patent
Ishizuka et al.

(10) Patent No.: US 7,799,660 B2
(45) Date of Patent: Sep. 21, 2010

(54) METHOD FOR MANUFACTURING SOI SUBSTRATE

(75) Inventors: Tohru Ishizuka, Gunma (JP); Hiroshi Takeno, Gunma (JP); Nobuhiko Noto, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 221 days.

(21) Appl. No.: 12/078,526

(22) Filed: Apr. 1, 2008

(65) Prior Publication Data

US 2008/0261411 A1 Oct. 23, 2008

(30) Foreign Application Priority Data

Apr. 23, 2007 (JP) ............................ 2007-112731

(51) Int. Cl.
*H01L 21/322* (2006.01)
(52) U.S. Cl. ...................... 438/473; 438/310; 438/402; 438/E27.112
(58) Field of Classification Search .................. 438/58, 438/143, 310, 402, 471–477; 257/506, 622–618, 257/E27.112
See application file for complete search history.

(56) References Cited

U.S. PATENT DOCUMENTS 7,582,950 B2 * 9/2009 Matsukawa et al. ......... 257/622

FOREIGN PATENT DOCUMENTS

| JP | A 5-82525 | 4/1993 |
| JP | A 10-214844 | 8/1998 |

* cited by examiner

*Primary Examiner*—Dung A. Le
(74) *Attorney, Agent, or Firm*—Oliff & Berridge, PLC

(57) ABSTRACT

The present invention provides a method for manufacturing an SOI substrate by which an oxygen ion is implanted from at least one of main surfaces of a single-crystal silicon substrate to form an oxygen-ion-implanted layer and then an oxide film-forming heat treatment that changes the formed oxygen-ion-implanted layer into a buried oxide film layer is performed with respect to the single-crystal silicon substrate to manufacture the SOI substrate, the method comprising: implanting a neutral element ion having a dose amount of $1\times10^{12}$ atoms/cm$^2$ or above and less than $1\times10^{15}$ atoms/cm$^2$ into a back surface to form an ion-implanted damage layer after performing the oxide film-forming heat treatment; and gettering a metal impurity in the ion-implanted damage layer by a subsequent heat treatment to enable reducing a metal impurity concentration on a front surface side. Thereby, there is provided a method for manufacturing an SOI substrate having a gettering layer on a back surface thereof in a simple process at a low cost.

8 Claims, No Drawings

METHOD FOR MANUFACTURING SOI SUBSTRATE

BACKGROUND OF THE INVENTION

1. Field of the Invention

The present invention relates to a method for manufacturing an SOI (Silicon On Insulator) substrate based on a SIMOX (Separation by IMplanted OXygen) method, and more particularly to a method for manufacturing an SOI substrate having a gettering capability.

2. Description of the Related Art

As one of substrates for semiconductor devices, there is an SOI substrate having a silicon layer (which will be referred to as an SOI layer hereinafter) formed on a buried silicon oxide film (which will be referred to as a BOX layer) as an insulator film. Since the SOI layer in a wafer front surface layer portion serving as a device fabrication region is electrically separated from the bulk substrate through the buried silicon oxide film layer (BOX layer), this SOI substrate has characteristics that a small parasitic capacitance, a high radiation-proof effect, and others. Therefore, a high-speed low-power-consumption operation and an effect of, e.g., avoiding a software error are expected, and the SOI substrate appears promising as a substrate for a high-performance semiconductor device.

As a typical method for manufacturing this SOI substrate, there is a wafer bonding method or a SIMOX method. The wafer bonding method is a method of forming a thermal oxide film on a surface of one of, e.g., two single-crystal silicon substrates (silicon wafers), then contacting the two wafers against each other through the formed thermal oxide film, carrying out a bonding heat treatment to increase a bonding strength, and thereafter carrying out, e.g., mirror polishing with respect to one wafer to reduce a film thickness, thereby manufacturing an SOI substrate.

On the other hand, the SIMOX method is a method of ion-implanting oxygen into a single-crystal silicon substrate, then performing a high-temperature heat treatment (oxide film-forming heat treatment) to react the implanted oxygen with silicon, and forming a BOX layer to manufacture an SOI substrate.

Specifically, for example, an oxygen ion is implanted into a single-crystal silicon substrate heated to approximately 300 to 500° C. from one surface. The method is generally classified into a high-dose method of setting an acceleration voltage to 150 to 200 keV and implanting the oxygen ion having a dose amount of approximately 1 to $2 \times 10^{18}/cm^2$ or above and a low-dose method of implanting the oxygen ion having a dose amount equal to or below this value as ion implantation conditions. Further, there is also a method called MLD (Modified Low Dose) by which an oxygen ion of approximately 2 to $4 \times 10^{17}/cm^2$ is implanted and then damage implantation of approximately 1 to $5 \times 10^{15}/cm^2$ is carried out to facilitate an ITOX (Internal Thermal Oxidation) effect. After the oxygen ion is implanted, a high-temperature oxide film-forming heat treatment (generally, 1300° C. or above) is performed in, e.g., an inert gas containing 50% or below of oxygen so that the implanted oxygen (oxygen-ion-implanted layer) is changed into an oxide film (BOX layer) having a thickness of approximately 100 to 200 nm.

As compared with the wafer bonding method, manufacture of the SOI substrate based on such a SIMOX method is considered to have advantages that a manufacturing process is simple, the SOI substrate can be manufactured from one single-crystal silicon substrate without requiring two wafers, and hence a cost of the substrate can be reduced.

However, in this SIMOX substrate, a damage is produced between the BOX layer and the silicon layer immediately below the BOX layer at the time of BOX formation based on ion implantation, and a metal impurity in the silicon layer immediately below the BOX layer serving as a trapping source of a metal, especially Ni mainly introduced from an SiC component in a heat treatment furnace during the high-temperature oxide film-forming heat treatment tends to have a high concentration. In such a case, there is a problem that electrical characteristics of the BOX layer, especially a dielectric breakdown voltage is degraded to deteriorate device characteristics.

Thus, to suppress an increase in a Ni concentration in the silicon layer under the BOX layer, forming a gettering layer having a capability (gettering capability) of trapping a metal impurity including Ni and others to be removed from a region serving as an active layer of a semiconductor device is important.

Therefore, there is a method of using a substrate having a polysilicon layer formed as a gettering layer on a back surface thereof. However, this method has problems of an increase in a price of the substrate leading to a decrease in a cost merit and poor flatness of an SOI substrate because of bad uniformity of a film thickness of the polysilicon layer.

Further, when a substrate having a crystal defect introduced to a back surface thereof due to, e.g., ion implantation is used as a starting material, the introduced crystal defect recovers during the high-temperature oxide film-forming heat treatment to avoid contribution as a gettering layer in some cases.

To prevent the defect from recovering during the heat treatment, the number of the crystal defects to be introduced must be increased, namely, a dose amount must be increased in case of ion implantation. Furthermore, when the high-temperature oxide film-forming heat treatment is performed in an oxidizing atmosphere, since thick oxide films are formed on both front and back surfaces, each crystal defect introduced in a shallow portion on the back surface is turned to the oxide film to avoid contribution as the gettering layer in some cases. Thus, the crystal defects must be deeply introduced beyond an oxide film-forming thickness in order to maintain a defect layer even after forming the oxide film. That is, in case of ion implantation, an acceleration voltage must be increased. Performing such ion implantation with a large dose amount and a high acceleration voltage does not lead to a manufacturing method having a simple process and a low cost.

Besides, as the gettering method of the SIMOX method, there is presented a method of performing a high-temperature heat treatment in a partial SIMOX substrate and then carrying out laser irradiation, ion implantation, sand blast, or polycrystal silicon layer deposition with respect to a back surface of the substrate to introduce crystal defects or crystal damages (see Japanese Patent Application Laid-open No. H05-82525). Moreover, there is also presented a method of amorphizing an SOI layer by implanting an argon ion to form a gettering region in the SOI layer based on the SIMOX method (see Japanese Patent Application Laid-open No. H10-214844).

However, it cannot be said that the above-explained methods do not have simple processes, and a manufacturing method with a low cost cannot be realized.

SUMMARY OF THE INVENTION

Thus, in view of the above-explained problems, it is an object of the present invention to provide a method for manufacturing an SOI substrate based on a SIMOX method having a gettering layer on a back surface thereof in a simple process at a low cost.

To achieve this object, according to the present invention, there is provided a method for manufacturing an SOI substrate by which an oxygen ion is implanted from at least one of main surfaces of a single-crystal silicon substrate to form an oxygen-ion-implanted layer and then an oxide film-forming heat treatment that changes the formed oxygen-ion-implanted layer into a buried oxide film layer is performed with respect to the single-crystal silicon substrate to manufacture the SOI substrate, the method comprising: implanting a neutral element ion having a dose amount of $1 \times 10^{12}$ atoms/cm$^2$ or above and less than $1 \times 10^{15}$ atoms/cm$^2$ into a back surface to form an ion-implanted damage layer after performing the oxide film-forming heat treatment; and gettering a metal impurity in the ion-implanted damage layer by a subsequent heat treatment to enable reducing a metal impurity concentration on a front surface side.

Implanting the neutral element ion in this manner enables forming an ion-implanted damage layer having a gettering capability that can reduce the metal impurity concentration in the substrate front surface even though the dose amount is small. Additionally, since the dose amount can be suppressed, the manufacturing process can be simplified and the cost can be reduced.

Further, according to the manufacturing method of the present invention, it is preferable that the oxide film-forming heat treatment is performed in an oxidizing atmosphere, then an oxide film on the back surface is removed, and subsequently neutral element ion implantation of forming the ion-implanted damage layer is performed.

Performing the oxide film-forming heat treatment in the oxidizing atmosphere enables forming a protective film on the entire surface of the SOI substrate at the same step. This protective film is useful for protecting the front surface side against contamination of the metal impurity at a subsequent step. Furthermore, removing the back surface oxide film facilitates forming the ion-implanted damage layer in the SOI substrate rather than the oxide film.

Moreover, according to the manufacturing method of the present invention, it is preferable that a neutral element to be ion-implanted is at least one of argon, carbon, oxygen, and silicon.

When these elements are used, it is possible to form the ion-implanted damage layer sufficiently having the gettering capability with respect to the metal impurity even though the dose amount is small.

Additionally, according to the manufacturing method of the present invention, it is preferable that an acceleration voltage when ion-implanting the neutral element is set to 200 keV or below.

As a result, since ion implantation can have a low energy, the apparatus used in the ion implantation process can be simplified.

As explained above, according to the present invention, after the oxide film-forming heat treatment is performed, the neutral element ion having the dose amount that is not smaller than $1 \times 10^{12}$ atoms/cm$^2$ and less than $1 \times 10^{15}$ atoms/cm$^2$ is implanted into the back surface to form the ion-implanted damage layer, and hence the metal impurity can be gettered in the ion-implanted damage layer by a subsequent heat treatment, thereby reducing the metal impurity concentration on the front surface side. As a result, the SOI substrate based on the SIMOX method having the low metal impurity concentration of the front surface thereof can be manufactured in a simple process at a low cost.

DETAILED DESCRIPTION OF THE PREFERRED EMBODIMENTS

The present invention will now be more specifically explained hereinafter.

As explained above, when ion implantation is adopted as a method of introducing crystal defects and others to a back surface after a high-temperature heat treatment, ion implantation with a high dose amount ($1 \times 10^{15}$ atoms/cm$^2$ or above) is required. The high gettering capability can be surely provided to an SOI substrate if the dose amount is high, but there is a drawback that ion implantation must be performed for a long time, productivity is lowered, and a cost is increased when the high dose amount is required. Therefore, development of a manufacturing method having the drawback solved has been awaited.

Thus, the present inventors have repeatedly keenly examined ion implantation conditions enabling forming an ion-implanted damage layer with a high gettering capability with respect to a metal impurity in a simple process at a low cost.

As a result, the present inventors have discovered that ion implanting a neutral element that is electrically inactive in silicon at the time of ion implantation enables forming an ion-implanted damage layer having a high gettering capability with respect to a metal impurity even though a dose amount is lower than a conventional amount $1 \times 10^{15}$ atoms/cm$^2$ or above).

Further, the present inventors have conceived manufacturing an SOI substrate based on the SIMOX method having the gettering capability with respect to a metal impurity at a relatively low cost based on this knowledge, thereby bringing the present invention to completion.

Embodiments according to the present invention will now be explained hereinafter, but the present invention is not restricted thereto.

First, a single-crystal silicon substrate is prepared, and an oxygen ion is implanted into one of main surfaces of the silicon substrate to form an oxygen-implanted layer. As oxygen ion implantation conditions, general conditions can be adopted. Specifically, an acceleration voltage can be set to 150 to 200 keV, and an oxygen ion dose amount can be set to approximately 1 to $2 \times 10^{18}$ atoms/cm$^2$ or above, or a lower dose amount can be set.

After forming the oxygen-implanted layer, a high-temperature oxide film-forming heat treatment is performed. As heat treatment conditions, general conditions can be adopted. For example, the high-temperature oxide film-forming heat treatment (generally, 1300° C. or above) can be performed in an inert gas containing 50% or below of oxygen. At this time, a metal impurity, e.g., Ni is introduced during this high-temperature oxide film-forming heat treatment and trapped in a silicon layer immediately below a BOX layer when a temperature is lowered.

Furthermore, when performing this high-temperature oxide film-forming heat treatment, it is preferable to perform this heat treatment in an oxidizing atmosphere.

When performing neutral element ion implantation with respect to a back surface of an SOI substrate, metal contamination may possibly occur from a front surface side. Therefore, forming a protective film on the front surface is desired, but since the oxide film is formed on the entire wafer surface when the oxide film is formed in the oxidizing atmosphere, this oxide film can be utilized as the protective film without adding other steps, which is efficient. As conditions in the oxidizing atmosphere, for example, an argon atmosphere in which an oxygen partial pressure is 40% can be adopted.

Both the front surface and the back surface of the wafer after the heat treatment are covered with the oxide films each having a thickness of approximately 200 to 1000 nm. Removing the oxide film on the back surface alone by single-side HF etching is preferable. When the oxide film on the back surface is removed in this manner, the oxide film does not obstruct when forming a damage layer based on neutral element ion implantation.

Since the purpose of the oxide film on the front surface side is protecting the front surface, a thickness of the oxide film that is as large as possible is preferable.

Then, neutral element ion implantation having a dose amount of $1\times10^{12}$ atoms/cm$^2$ or above and less than $1\times10^{15}$ atoms/cm$^2$ is performed with respect to the back surface.

Since the high gettering capability cannot be obtained when the dose amount is less than $1\times10^{12}$ atoms/cm$^2$, the dose amount is set to $1\times10^{12}$ atoms/cm$^2$ or above. Moreover, since ion implantation must be performed for a long time, productivity is lowered, and a cost is increased when the dose amount exceeds $1\times10^{15}$ atoms/cm$^2$, the dose amount is set to be less than $1\times10^{15}$ atoms/cm$^2$.

As a neutral element to be ion-implanted, argon is preferable, but the same effect can be obtained when carbon, oxygen, and silicon are used.

An acceleration voltage of the ion is preferably set to 200 keV or below. When the acceleration voltage is increased, a gettering region is formed closer to the inside of a bulk and gets closer to a metal contaminant, e.g., Ni trapped below the BOX layer. Therefore, this structure is advantageous to getter this metal contaminant. However, since the ion is implanted into the back surface of the SOI substrate having a thickness of several-hundred μm or above, the gettering effect is hardly improved based on movement (approximately 1 μm at most) of the gettering region due to an increase in an implantation energy. Instead, considering an increase in a cost due to an energy loss to suppress the acceleration voltage to 200 keV or below is preferable.

Subsequently, a heat treatment is carried out for the purpose of, e.g., gettering at 1000° C. or above for 1 to 10 hours. A heavy metal, e.g., Ni trapped in the silicon layer immediately below the BOX layer by this heat treatment diffuses and moves to a gettering layer introduced to the back surface. Then, when the oxide film on the front surface is removed, the SOI substrate based on the SIMOX method having a low metal impurity concentration of the front surface can be obtained.

It is to be noted that this heat treatment process carried out for the purpose of gettering is not necessarily a required process. That is because the gettering effect can be demonstrated by the heat treatment in a device process if the ion-implanted damage layer is formed on the back surface.

EXAMPLES

The present invention will now be more specifically explained hereinafter with reference to examples and a comparative example, but the present invention is not restricted thereto.

Example 1

A single-crystal silicon substrate having a diameter of 300 mm was prepared. Then, oxygen ion was implanted into this silicon substrate under conditions of an acceleration voltage of 190 keV and a dose amount of $2.3\times10^{17}$ atoms/cm$^2$ to form an oxygen-ion-implanted layer.

Then, in an argon atmosphere in which an oxygen partial pressure is 40%, an oxide film-forming heat treatment including a process at 1320° for four hours was performed. An oxide film thickness on each of a front surface and a back surface after the heat treatment was 675 nm. The oxide film on the back surface alone was removed by single-side HF etching. On the front surface side, the oxide film having the thickness of 675 nm was maintained as it is.

Thereafter, argon ion implantation was performed with respect to the back surface under conditions of a dose amount of $9.5\times10^{14}$ atoms/cm$^2$ and an acceleration voltage of 100 keV. Subsequently, a gettering heat treatment was carried out at 1000° C. for four hours in an argon atmosphere where an oxygen partial pressure is 1%, and then the oxide film on the front surface was removed by HF cleaning, thereby fabricating an SOI substrate.

Subsequently, an Ni concentration in an SOI layer, a BOX layer, and a silicon layer having a depth of 1 μm immediately below the BOX layer on the front surface of the fabricated SIMOX substrate was measured based on ICP-MS.

As a result, it was found that the Ni concentration of the SOI substrate front surface is $8\times10^9$ atoms/cm$^2$.

Comparative Example 1

Like Example 1, a single-crystal silicon substrate having a diameter of 300 mm was prepared. Then, oxygen ion was implanted into this silicon substrate under conditions of an acceleration voltage of 190 keV and a dose amount of $2.3\times10^{17}$ atoms/cm$^2$ to form an oxygen-ion-implanted layer.

Thereafter, in an argon atmosphere where an oxygen partial pressure is 40%, an oxide film-forming heat treatment containing a process at 1320° C. for four hours was performed. An oxide film thickness on each of a front surface and a back surface after the heat treatment was 675 nm.

Subsequently, the oxide films on both the front surface and the back surface were removed by HF cleaning without performing implantation of a neutral element ion into the back surface and a gettering heat treatment, thereby fabricating an SOI substrate. A Ni concentration of the thus fabricated SOI substrate was evaluated by the same method as Example 1.

As a result, it was found that the Ni concentration of the SOI substrate front surface is $3\times10^{11}$ atoms/cm$^2$.

Based on results of Example 1 and Comparative Example 1, when neutral element ion implantation was performed and a metal impurity was gettered in the ion-implanted damage layer, the Ni concentration of the SOI substrate front surface was greatly reduced.

Therefore, $1\times10^{15}$ atoms/cm$^2$ or above is required as a dose amount of the ion used to form the damage layer in the conventional example. However, according to the present invention, it is possible to fabricate the ion-implanted damage layer having the high gettering capability of reducing a concentration of a metal impurity in the substrate front surface even though a dose amount is lower than the conventional value. Therefore, the metal impurity concentration can be reduced even though the process is simple.

Example 2

An SOI substrate was fabricated under the same conditions as Example 1 except that the dose amount of an argon ion that is implanted into a back surface in Example 1 was changed to $5\times10^{14}$ atoms/cm$^2$. A Ni concentration of the thus fabricated SOI substrate was evaluated by the same method as Example 1.

As a result, it was found that the Ni concentration of the SOI substrate front surface is $1.2\times10^{10}$ atoms/cm$^2$.

It was revealed from this result that the concentration of the metal impurity of the SOI substrate front surface could be greatly reduced even though a neutral element ion implantation amount is low.

Example 3

An SOI substrate was fabricated under the same conditions as Example 2 except that a type of the neutral element ion implanted into a back surface in Example 2 was changed to a silicon ion. A Ni concentration of the thus fabricated SOI substrate was evaluated by the same method as Example 1.

As a result, it was found that the Ni concentration of the SOI substrate front surface is $1.3\times10^{10}$ atoms/cm$^2$.

It was revealed from this result that the neutral element ion to be implanted is not restricted to argon and the same effect can be obtained when, e.g., silicon is used.

Example 4

An SOI substrate was fabricated under the same conditions as Example 1 except that the dose amount of an argon ion that is implanted into a back surface in Example 1 was changed to $1\times10^{12}$ atoms/cm$^2$. A Ni concentration of the thus fabricated SOI substrate was evaluated by the same method as Example 1.

As a result, it was found that the Ni concentration of the SOI substrate front surface is $8\times10^{10}$ atoms/cm$^2$.

It was revealed from this result that the concentration of the metal impurity of the SOI substrate front surface could be sufficiently reduced even if a neutral element ion implantation amount is decreased.

As explained above, according to the manufacturing method of the present invention, even if readily feasible ion implantation of implanting an argon ion with a low dose amount and a low energy is adopted, the gettering layer having the high gettering capability with respect to a metal impurity can be formed, and gettering the metal impurity in this gettering layer enables manufacturing the SOI substrate based on the SIMOX method in which a concentration of the metal impurity, especially Ni in the front surface is low in a simple process at a low cost.

The present invention is not restricted to the embodiment described above. The above-described aspects are mere examples and those having substantially the same structure as technical ideas described in the appended claims and providing the similar functions and advantages are included in the scope of the present invention.

What is claimed is:

1. A method for manufacturing a silicon on insulator (SOI) substrate from a single-crystal silicon substrate having a front main surface and a back main surface by which an oxygen ion is implanted into one of the main surfaces of the single-crystal silicon substrate to form a front surface side with an oxygen-ion-implanted layer and then an oxide film-forming heat treatment that changes the formed oxygen-ion-implanted layer into a buried oxide film layer is performed with respect to the single-crystal silicon substrate to manufacture the SOI substrate, the method comprising:

implanting a neutral element ion having a dose amount of $1\times10^{12}$ atoms/cm$^2$ or above and less than $1\times10^{15}$ atoms/cm$^2$ into the back main surface of the single-crystal silicon substrate to form an ion-implanted damage layer after performing the oxide film-forming heat treatment; and gettering a metal impurity in the ion-implanted damage layer by a subsequent heat treatment to enable reducing a metal impurity concentration on the front surface side.

2. The method for manufacturing an SOI substrate according to claim 1, wherein the oxide film-forming heat treatment that changes the formed oxygen-ion-implanted layer into the buried oxide film layer is performed in an oxidizing atmosphere, then an oxide film on the back main surface of the single-crystal silicon substrate formed by the oxide film-forming heat treatment that changes the formed oxygen-ion-implanted layer into the buried oxide film layer performed in the oxidizing atmosphere is removed, and subsequently neutral element ion implantation of forming the ion-implanted damage layer is performed.

3. The method for manufacturing an SOI substrate according to claim 1, wherein a neutral element to be ion-implanted is at least one of argon, carbon, oxygen, and silicon.

4. The method for manufacturing an SOI substrate according to claim 2, wherein a neutral element to be ion-implanted is at least one of argon, carbon, oxygen, and silicon.

5. The method for manufacturing an SOI substrate according to claim 1, wherein an acceleration voltage when ion-implanting the neutral element is set to 200 keV or below.

6. The method for manufacturing an SOI substrate according to claim 2, wherein an acceleration voltage when ion-implanting the neutral element is set to 200 keV or below.

7. The method for manufacturing an SOI substrate according to claim 3, wherein an acceleration voltage when ion-implanting the neutral element is set to 200 keV or below.

8. The method for manufacturing an SOI substrate according to claim 4, wherein an acceleration voltage when ion-implanting the neutral element is set to 200 keV or below.

* * * * *